United States Patent [19]

Gloanec et al.

[11] 4,320,313

[45] Mar. 16, 1982

[54] GUNN-EFFECT DEVICE MODULATABLE BY CODED PULSES, AND A PARALLEL-SERIES DIGITAL CONVERTER USING SAID DEVICE

[75] Inventors: Maurice Gloanec; Rene Castagne, both of Paris, France

[73] Assignee: Thomson-CSF, Paris, France

[21] Appl. No.: 75,537

[22] Filed: Sep. 13, 1979

Related U.S. Application Data

[63] Continuation of Ser. No. 889,659, Mar. 21, 1978, abandoned.

[30] Foreign Application Priority Data

Mar. 25, 1977 [FR] France ............................. 77 08998

[51] Int. Cl.$^3$ .................... H01L 47/02; H01L 27/26
[52] U.S. Cl. .................................. 307/243; 307/478; 357/3; 357/15
[58] Field of Search ....................... 357/3, 61, 15, 22; 307/243, 450, 478

[56] References Cited

U.S. PATENT DOCUMENTS

| 3,452,222 | 6/1969 | Shoji ............................. 357/3 |
| 3,518,502 | 6/1970 | Dorman et al. ................. 357/3 |
| 3,553,677 | 1/1971 | Cattermole .................... 357/3 |
| 3,587,000 | 6/1971 | Heeks ............................ 357/3 |
| 3,667,003 | 5/1972 | Hilsum et al. ................. 357/3 |
| 3,766,372 | 10/1973 | Kataoka et al. .............. 357/3 |
| 4,047,199 | 9/1977 | Kataoka et al. .............. 357/3 |

FOREIGN PATENT DOCUMENTS 1516893 6/1969 Fed. Rep. of Germany .

OTHER PUBLICATIONS

Mizatani et al., Electronics Letters, vol. 11, Nos. 25–26, Dec. 11, 1975, pp. 638–639.
Hilsum, Proceedings of the IRE, vol. 50, pp. 185–189, Feb. 1962.
Tanimoto et al., Annu. Rep. Eng. Res. Inst. Fac. Eng. Univ. Tokyo (Japan), vol. 34, Sep. 1975, pp. 205–210.

Primary Examiner—William D. Larkins
Attorney, Agent, or Firm—Cushman, Darby & Cushman

[57] ABSTRACT

A Gunn-effect device originated from a Gunn-triode wherein electrodes are added between gate and anode for receiving high and low potentials representing states 1 and 0 of a binary code. In a normal Gunn-triode a very short pulse on the gate produces a dipole domain which is propagated to the anode within a time of the order of the nanosecond. In the present device, under each finger brought temporarily to a low potential, there is produced a space charge which induces a negative pulse in the anode current of the Gunn device upon the passage of a dipole domain under the finger. Consequently, a series of successive pulses corresponds to a combination of simultaneous binary states. A digital converter using this device is proposed for converting simultaneous binary signals into successive binary signals.

6 Claims, 7 Drawing Figures

GUNN-EFFECT DEVICE MODULATABLE BY CODED PULSES, AND A PARALLEL-SERIES DIGITAL CONVERTER USING SAID DEVICE

This is a continuation, of application Ser. No. 889,659 filed Mar. 21, 1978, now abandoned.

The invention relates to a Gunn effect device which can be modulated by coded pulses, and a digital converter of the parallel series type using said device.

A semiconductor structure which has the appearance of a field-effect transistor on a semi-insulator substrate in which the gate is disposed in a dissymmetrical manner between the source and drain electrodes, the length of the conducting channel proper (under the gate) being much shorter than the distance between the gate and the drain and the sorce, here termed the cathode, being much nearer to the gate than the drain, here termed the anode, is to the gate. The semiconductor materials which is suitably doped is so chosen as to have the Gunn effect, that is to say the phenomenon of negative differential mobility of the charge carriers, when the electric field in the material exceeds a critical or threshold value. This is the case of monocrystalline gallium arsenide, gallium antimonide Ga Sb or the compound Ga In Sb.

A particular mode of the Gunn effect is manifested by the appearance of a "dipole domain" within the semiconductor material, in which the density of the conduction electrons is discontinuous. Such a domain is unstable and tends to be propagated from the cathode to the anode. There is distinguished in the domain of instability a leading front of quasi-zero density which is likened to a space-charge zone and a trailing front having a high density which is termed the accumulation zone.

In a Gunn triode, in the absence of a pulse on the gate, of the Schottky type, the channel is traveled through by a current of rest in the anode-cathode direction, the requirements being met, in particular as concerns the potentials applied to the electrodes, for the electric field in the semiconductor material to be throughout lower than the critical field.

It is possible, if certain further conditions of doping of the semiconductor material, length of the travel and thickness of the channel are satisfied, to "trigger" the triode, that is to say create under the gate a domain which will move toward the anode. In the case of N-doped gallium arsenide, the phenomenon is triggered by applying a pulse of negative voltage to the gate which creates a space charge or tends to increase a pre-existing space charge of small volume under the metallization of the Schottky-type gate. As the current flux is conservative, the action results in an increase of the electric field in the material and promotes the creation of a dipole domain from a point where the electric field exceeds the critical value.

If there is applied to the gate a series of clock pulses of suitable frequency of recurrence, there will be received on the anode a series of negative pulses of current between the cathode and anode of durations equal to the time of propagation of the domain between the gate and the anode. This time of propagation is of the order of 600 $ps$ for a gate anode distance of 50 microns in the gallium arsenide. This pulse is characterized by its rise and decay times which are much shorter than the nanosecond. The nucleation (appearance of a domain) is of a duration less than 100 $ps$ and its disappearance has a duration of the same order.

The anode pulse can be given a more complex form by providing a notch on the path of the domain. It concerns a decrease in the effective section of the semiconductor material offered to the cathode-anode current, for example a notch formed in the N-doped material without affecting the insulating substrate. The current of rest is practically unaffected by such a notch. On the other hand, upon the passage of the domain in the region of the notch there is produced a sudden decrease in the cathode-anode current which ceases after the passage of the domain. The output pulse has therefore a profile which is modified as a function of the position and width of the notch.

The invention permits the obtainment of a digital information in the form of a coding of the intensity of the current traveling through the Gunn device between the anode and the cathode. For this purpose, the conventional structure of a Gunn triode is modified by adding thereto in the gate-anode space a "keyboard" of electrodes capable of creating spacecharge zones which perform a function similar to that of the notches.

According to the invention there is provided a Gunneffect device modulatable by coded pulses, of the type comprising on a semi-insulator substrate, a layer of monocrystalline semiconductor material having the property of negative differential mobility of the charge carriers, and, on said layer, conventional anode, gate, and cathode of a Gunn triode, said device further comprising a series of electrodes or "fingers" which succeed each other in the gap located on the surface of said layer between the gate and the anode, polarization means for applying as desired, to each one of said electrodes either a potential capable of creating a spacecharge zone in the portion of material located in the vicinity of the considered electrode, or a potential which does not create a space charge in said portion.

According to a feature of the devices employing propagation of dipole domains in planar structures (as opposed to volumic propagation structures), the thickness of the layer, namely $a_o$ in centimeters and its concentration $n_o$ in the number of doping atoms per cubic centimeter (donor atoms in the case of N-doped As Ga) satisfy the relationship:

$$a_o n_o \geq L_o$$

wherein $L_o$ is a limit below which the appearance or the propagation of a dipole domain is not possible ($L_o = 10^{11}$ cm$^{-2}$ for N-doped As Ga).

According to another feature of the invention, given the thickness $a_o$ and the concentration $n_o$, the different potentials applied to the electrodes of the device according to the invention are such that the maximum electric field in the space-charge zones, or in their immediate vicinity, is less than the breakdown field in the semiconductor material.

A better understanding of the invention will be had and other features will be apparent from the ensuing description with reference to the accompanying drawings in which.

Figure 1:
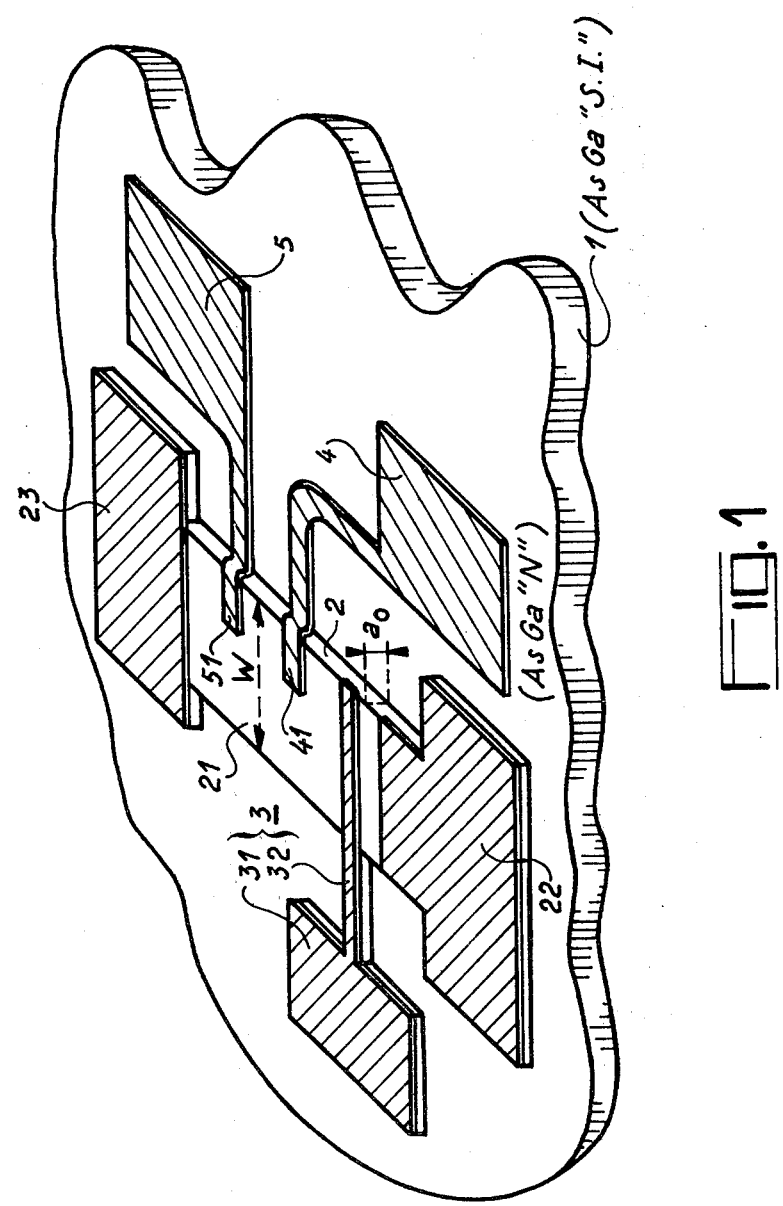
FIG. 1 represents a device according to the invention.

FIG. 1 shows a part of a semiconductor plate, for example of monocrystalline gallium arsenide. A device according to the invention has been formed on this part. On the remainder of the plate there have been formed, as the case may be, similar or different devices as is usual in the technology of integrated circuits. By prior epitaxy followed by a cutting out there was formed a "bar" 2 of N-doped monocrystalline gallium arsenide of a thickness $a_o$, for example $2.10^{-4}$ cm. The concentration $n_o$ of donor atoms is for example $10^{15}$ to $10^{16}$ atoms per cubic centimeter; it is determined in such manner as to give to the deposit such conductivity that there is received a given power for the output signals of the device. It is checked whether: $a_o \times n_o = 0.0002 \times 10^{15}$ namely $2.10^{11}$, is effectively higher than the limit of $10^{11}$ cm$^{-2}$ already mentioned which is valid in the case of gallium arsenide.

The deposit 2 comprises two rectangular sided members interconnected by a conduction band 21 of constant length W.

In the course of the same manufacturing step, there was machined a layer 3 of N-doped gallium arsenide identical to that of the bar 2 having the shape of a rectangular-sided figure extended by a very thin band connecting the deposits 2 and 3 in the region of the future gate 32; the latter is formed by a metal deposit 31 the appendix 32 of which forms a Schottky gate.

In the course of this same metallization stage, there was formed, apart from the gate, a cathode 22 previously treated as an ohmic contact and anode 23, the latter being much further from the gate than the cathode. Two (or more) metallizations are formed on the substrate overlapping the band 21 in the form of fingers 41 and 51 which are located between the metallizations 32 (gate) and the metallizations 23 (anode).

The principle of operation of the device modulated by coded pulses is the following.

Figure 2:
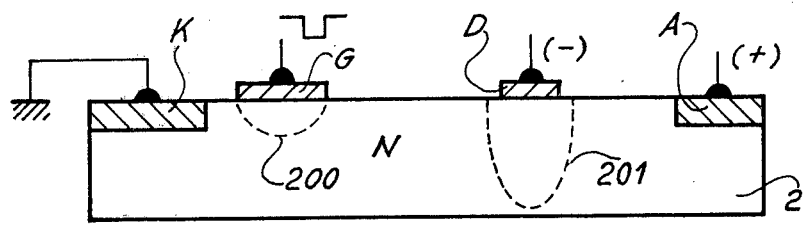
FIG. 2 is a sectional view intended to illustrate the principle of the device according to the inventon.

Let K, G and A be respectively the cathode, the gate and the anode of a Gunn triode which is diagrammatically shown in FIG. 2, by limiting the semiconductor material to the conduction band 2. It has been supposed that the cathode and anode contacts are of the "ohmic" type, a part of the metallization forming an alloy with the semiconductor material. Further, only a single finger D is shown between the gate and anode which is a contact of Schottky type, as is the gate G.

By means of supply or polarization connections, the following potentials are applied:

at K, the potential of earth (permanently);
at A, a positive potential (permanently);
at G, alternately the potential of earth and then a negative potential $-\Delta V_{GK}$ by recurring pulses of the clock type, the period of recurrence being greater than the time of propagation $T_0$ of a dipole domain between the gate and anode in the Gunn device;
at D, either a potential $V_1$ which is that of the bar located in the region of the point D, or a potential $V_o$ which is less than or equal to $V_1$ minus the voltage necessary for putting the zone located under the finger ($V_{DK}$) in space charge.

Figure 3:
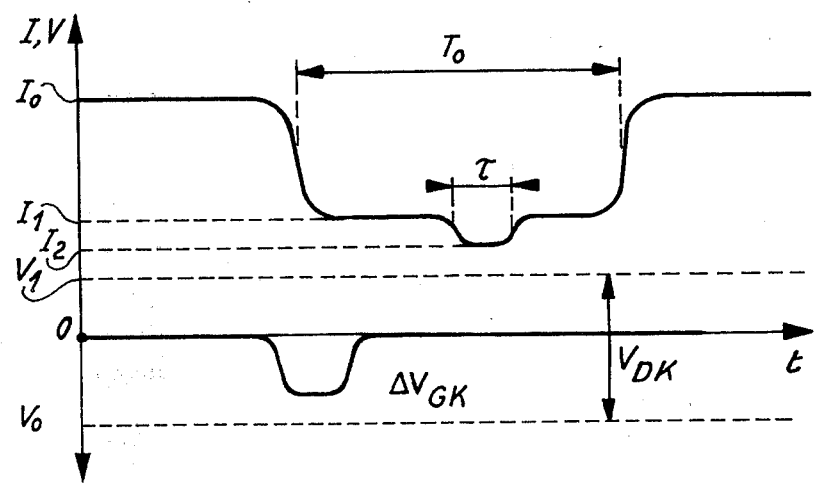
FIG. 3 is a diagram of voltage and current with respect to time.

FIG. 3 represents on the same graph in rectangular coordinated with the time plotted as abscissas (axis Ot):

the intensity I of the current circulating between the cathode and the anode in the conduction band 2;

the potentials of the electrodes G and D which appear on the negative side of the axis of the coordinates, since they are negative or zero relative to the potential of the earth.

The pulse $-\Delta V_{GK}$ has been shown in full line and the potential $V_0$ and $V_1$ have been shown in dotted lines.

The case of a potential "$V_0$" on the finger D will be first examined.

The pulse of the gate initiates the conventional phenomenon of the Gunn triode, namely the formation of the dipole domain under the space-charge zone 200 created under the electrode of the gate. This domain is propagated toward the anode and the intensity is reduced from $I_0$ to $I_1$ owing to the presence of the domain between the anode and cathode.

Owing to the negative potential of the finger D, there is also a space-charge zone 201 under the finger which produces upon the passage of the domain a further decrease of current from $I_1$ to $I_2$. During the small interval of time during which the domain passes under the space charge 201 there is thus obtained a pulse of duration $\tau$.

On the other hand, in the case where the finger is at potential $V_1$, no space charge is produced under the finger and the current remains equal to $I_1$ throughout the propagation of the domain between the gate and anode.

If there is a second finger between the gate and anode, as is the case in FIG. 1, the two fingers being put simultaneously at "low" potential, there will be received in the anode-cathode current two successive pulses of duration $\tau$ at instants separated by an interval of time equal to the duration of propagation of a dipole domain between the two fingers.

Thus it may be considered that two simultaneous pulses embodied by "high" or "low" states (bits "1" or "0") are converted into two successive pulses.

More generally, n pulses constituted by bits "0" or "1" applied simultaneously during the time $T_0$ are converted by a device according to invention into n successive pulses reproducing the "low" or "high" states in the order of succession of the fingers between the gate and anode.

This fundamental property of the invention has its application in a "parallel-series" digital converter.

Figure 4:
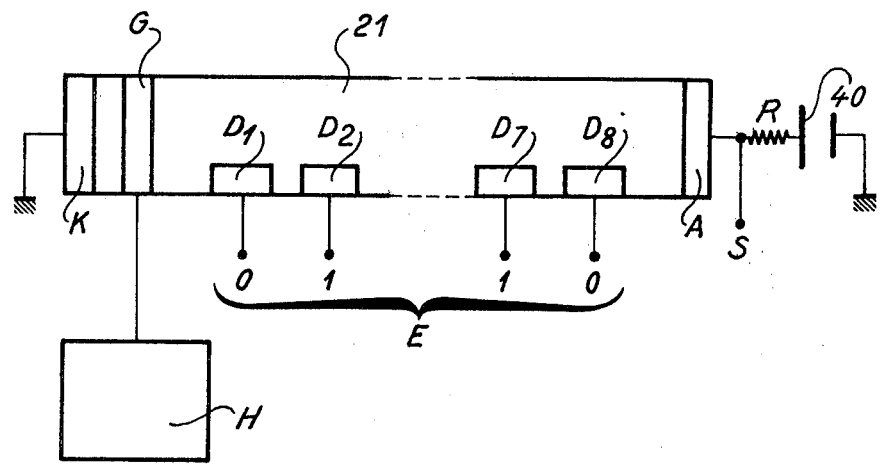
FIG. 4 represents in outline a "parallel-series" converter using a device according to the invention.

FIG. 4 represents diagrammatically such a converter the essential part of which is a device according to invention.

There have been shown by way of example between the gate G and the anode A of a Gunn triode four fingers ($D_1$, $D_2$ ... $D_7$, $D_8$) of a series of eight fingers adapted to receive the 8 bits of a signal sample of the type formed in time division multiplexing telephone systems, for example in the PCM (pulse code modulation system).

The fingers receive digital signals in the form of potentials "0" (low) or "1" (high). The connections of the fingers are connected to an input circuit assembly of the converter symbolically represented by the letter E, assuming that this assembly is placed in a region of the PCM system where the signals comprise pulses in parallel, that is to say simultaneous pulses.

The output of the converter is between earth and a terminal S of a load resistor R which is integrated in the device either adjacent to the anode or adjacent to the cathode. This resistor is not shown in FIG. 1 and appears between anode and supply battery of the converter. The gate G is supplied with negative pulses by a device similar to a clock H.

Figure 5:
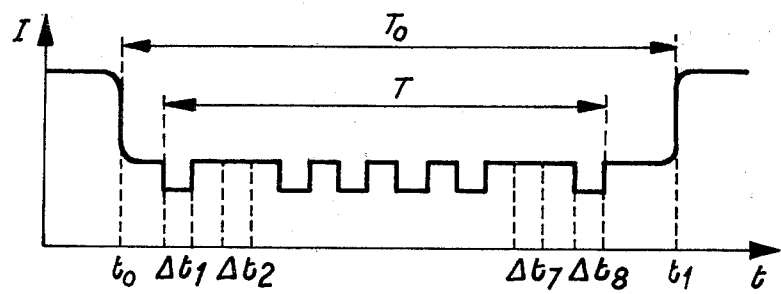
FIG. 5 is a diagram of current with respect to time.

The operation of the converter is illustrated by the diagram of FIG. 5 in which the anode current I is represented as a function of time t.

Between two instants $t_0$ and $t_1$, there is a negative pulse of anode current of duration $T_0$ similar to that shown in FIG. 3.

During the duration $T_0$, a dipole domain circulates from the gate to the anode and consequently negative or zero pulses $\Delta t_1, \Delta t_2, \ldots \Delta t_8$ are produced each time that one of the fingers (here $D_1, D_3 \ldots D_7, D_8$) has the potential "0". FIG. 5 shows by way of example the combination 01000010.

Such a combination, or another similar combination appears "in parallel" on the fingers $D_1$ to $D_8$ for a duration at least equal to $T_0$, at an instant determined by the clock H, then converted into a series of "series" pulses the duration of which is equal to T at the most equal to $T_0$.

The order of magnitude of the durations T and $T_0$ is the nanosecond.

The order of magnitude of the durations $t_1 \ldots t_8$ is the tenth of a nanosecond.

Figure 6:
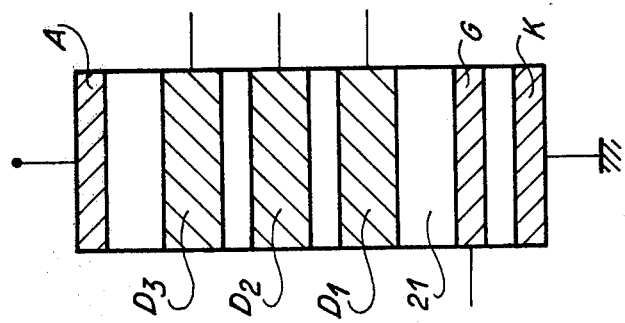

FIG. 6 represents another embodiment of the invention in which the fingers $D_1$, $D_2$ and $D_3$ are metallizations occupying the entire width of the band 21 of semiconductor material serving as a conducting channel between the gate and anode.

Figure 7:
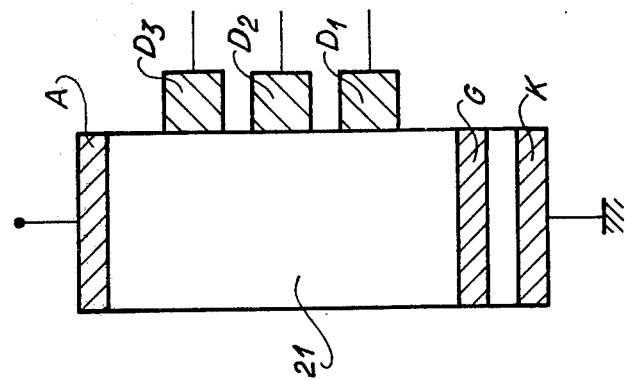
FIG. 6 and 7 are schemes of other embodiments of the invention.

FIG. 7 represents another modification of the invention in which the fingers $D_1$, $D_2$ and $D_3$ project from the side of the band 21. It is the semiconductor band itself which has such projections which receive metallizations similar to those of the fingers of FIG. 1. In the latter modification, the potential "1" applied to a finger produces a positive anode current pulse owing to the increase in the section of the conducting channel in the region of the finger. On the other hand, it is the potential "0" which results in the absence of a pulse at the output of the device.

Among the advantages of the invention which have not already been cited there may be mentioned:

the possibility of converting a pulse of the order of the nanosecond into a pulse whose duration is one tenth thereof;

the rapidity of the "parallel-series" pulses conversion;

the construction of devices in the form of integrated circuits.

What we claim is:

1. A Gunn-effect device integrated on the planar-side of a semiconductor device comprising:
    a semi-insulating substrate
    an n-doped epitaxial layer able to exhibit the phenomenon of negative differential mobility of its charge carriers and forming a first band whose each end bears an ohmic contact;
    a second band narrower than the first band extending laterally from the first band and terminated by a larger area, said second band bearing a Schottky contact;
    a plurality of fingers each finger comprising a metallization formed on said substrate, said fingers overlapping the first band and being located between the second band and one of the ohmic contacts; and
    means for applying pulses of a predetermined voltage to said fingers to create space charge zones within said bands for limiting the Gunn domain in said first band under said fingers and for lessening without extinguishing a current within the device.

2. A device as claimed in claim 1, wherein said semiconductor material is gallium arsenide and said epitaxial layer has a thickness $a_o$ centimeters and a concentration $n_o$ of donor atoms per cubic centimeter, $a_o$ and $n_o$ conforming to the following inequality: $(a_o)(n_o) \geq 10^{11}$.

3. A device as claimed in claim 1, wherein said semiconductor material is Ga Sb.

4. A device as claimed in claim 1, wherein said semiconductor material is Ga In Sb.

5. A device as claimed in claim 1, wherein said epitaxial layer has lateral projections covered with metallizations constituting said "fingers".

6. A digital parallel-series converter comprising a device as claimed in claim 1, and means for supplying to the Schottky contact clock pulses having a period of recurrence $T_0$; means for applying in parallel to said "fingers" pulses of potential representing binary states, and means for extracting in series current pulses from the anode of said device.

* * * * *